(12) United States Patent
Wang et al.

(10) Patent No.: US 12,426,473 B2
(45) Date of Patent: Sep. 23, 2025

(54) DISPLAY PANEL AND DISPLAY DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Qingxia Wang, Wuhan (CN); Ruiqi Huang, Wuhan (CN); Peng Zhang, Wuhan (CN); Jingjing Huang, Wuhan (CN); You Gao, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 29 days.

(21) Appl. No.: 18/625,152

(22) Filed: Apr. 2, 2024

(65) Prior Publication Data

US 2025/0081792 A1 Mar. 6, 2025

(30) Foreign Application Priority Data

Aug. 29, 2023 (CN) .......................... 202311100833.0

(51) Int. Cl.
  *H10K 59/40* (2023.01)
  *G06F 3/041* (2006.01)
  *G06F 3/044* (2006.01)
  *H10K 59/131* (2023.01)

(52) U.S. Cl.
  CPC .......... *H10K 59/40* (2023.02); *G06F 3/0412* (2013.01); *G06F 3/04164* (2019.05); *G06F 3/0443* (2019.05); *H10K 59/131* (2023.02); *G06F 2203/04102* (2013.01); *G06F 2203/04107* (2013.01)

(58) Field of Classification Search
  None
  See application file for complete search history.

(56) References Cited

U.S. PATENT DOCUMENTS

| 12,039,115 B2* | 7/2024 | Fang .................... G06F 3/04164 |
| 2019/0273124 A1* | 9/2019 | Leng ....................... H10K 59/40 |
| 2024/0045529 A1* | 2/2024 | Fang ....................... G06F 3/0412 |

FOREIGN PATENT DOCUMENTS

| CN | 113360030 A | | 9/2021 | |
| CN | 113515205 A | * | 10/2021 | ........... G06F 3/0412 |

* cited by examiner

*Primary Examiner* — Duane N Taylor, Jr.
(74) *Attorney, Agent, or Firm* — Anova Law Group, PLLC

(57) ABSTRACT

Display panel and display device are provided. The display panel includes a display area and a non-display area. The non-display area includes a bending area and a first area. The first area is located on a side of the bending area away from the display area. The display panel comprises a substrate, a driving array layer disposed on a side of the substrate, and a touch function layer disposed on a side of the driving array layer away from the substrate. The driving array layer includes a first metal layer. In the first area, the first metal layer includes a plurality of first touch signal lines and a plurality of first fixed potential signal lines. At least one first fixed potential signal line of the plurality of first fixed potential signal lines is disposed between two adjacent first touch signal lines of the plurality of first touch signal lines.

20 Claims, 11 Drawing Sheets

DISPLAY PANEL AND DISPLAY DEVICE

CROSS-REFERENCE TO RELATED APPLICATION

This application claims priority of Chinese Patent Application No. 202311100833.0, filed on Aug. 29, 2023, the entire content of which is hereby incorporated by reference.

FIELD OF THE DISCLOSURE

The present disclosure generally relates to the field of display technology and, more particularly, relates to a display panel and a display device.

BACKGROUND

Organic Light-Emitting Diode (OLED) display devices may have excellent characteristics such as thinness, active light emission, fast response speed, large viewing angle, wide color gamut, high brightness, low power consumption, and possibility of realizing flexible screens. OLED display devices are recognized by the industry as one of the most promising types of display devices. With the development of portable electronic display devices, a touch screen and a flat display device may be integrated to form a touch display device with a touch function. Input to a touch display device may be performed through fingers, stylus, etc., making input operation intuitive and simple. Nowadays, touch technologies commonly used include resistive touch panels and capacitive touch panels. However, for the sake of controllability, usage easiness, and surface appearance, most users may choose capacitive touch panels. In existing technology development for OLED touch display screens, considering the difficulty in manufacturing processes, touch technology with a touch functional structure layer disposed over an OLED light-emitting device layer may often be used.

In existing technology, to increase a screen-to-body ratio of an existing touch display device, a circuit binding method of Chip On Flexible Printed Circuit (COP) is often used in an OLED display panel. A flexible printed circuit may be bound to a bending area of an OLED flexible display panel. The bending area of the flexible display panel may be bent toward the back of the flexible display panel to reduce the frame width of the display device. However, this type of narrow frame design may cause coupling interference between touch lines of the touch function layer. Accordingly, touch signal deviation may appear, and touch detection effects may be affected.

As such, providing a display panel and a display device with a narrow frame design and improved touch performance, without affecting production efficiency and structure simplification, is an urgent technical problem that needs to be solved by those skilled in the art.

SUMMARY

One aspect of the present disclosure includes a display panel. The display panel includes a display area and a non-display area. The non-display area includes a bending area and a first area, and along a first direction, the first area is located on a side of the bending area away from the display area. The display panel comprises a substrate, a driving array layer disposed on a side of the substrate, and a touch function layer disposed on a side of the driving array layer away from the substrate. The driving array layer at least includes a first metal layer, and no other metal layers are disposed between the first metal layer and the touch function layer. In the first area, the first metal layer includes a plurality of first touch signal lines and a plurality of first fixed potential signal lines. At least one first fixed potential signal line of the plurality of first fixed potential signal lines is disposed between two adjacent first touch signal lines of the plurality of first touch signal lines.

Another aspect of the present disclosure includes display device. The display device includes a display panel. The display panel includes a display area and a non-display area. The non-display area includes a bending area and a first area, and along a first direction, the first area is located on a side of the bending area away from the display area. The display panel comprises a substrate, a driving array layer disposed on a side of the substrate, and a touch function layer disposed on a side of the driving array layer away from the substrate. The driving array layer at least includes a first metal layer, and no other metal layers are disposed between the first metal layer and the touch function layer. In the first area, the first metal layer includes a plurality of first touch signal lines and a plurality of first fixed potential signal lines. At least one first fixed potential signal line of the plurality of first fixed potential signal lines is disposed between two adjacent first touch signal lines of the plurality of first touch signal lines.

Other aspects of the present disclosure may be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
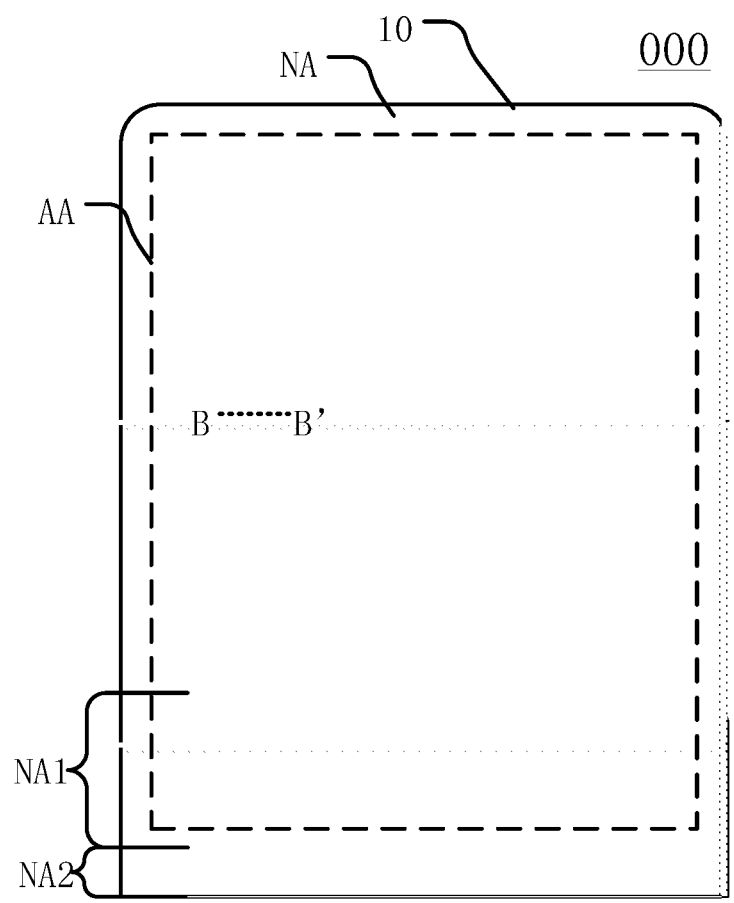
FIG. 1 illustrates a schematic plan view of a display panel consistent with the disclosed embodiments of the present disclosure.

To make the objectives, technical solutions and advantages of the present disclosure clearer and more explicit, the present disclosure is described in further detail with accompanying drawings and embodiments. It should be understood that the specific exemplary embodiments described herein are only for explaining the present disclosure and are not intended to limit the present disclosure.

Technologies, methods, and equipment known to those of ordinary skill in relevant fields may not be discussed in detail, but where appropriate, these technologies, methods, and equipment should be regarded as part of the specification.

Reference will now be made in detail to embodiments of the present disclosure, which are illustrated in the accompanying drawings. Similar labels and letters designate similar items in the drawings. Once an item is defined in one drawing, the item may not be defined and discussed in subsequent drawings.

Figure 2:
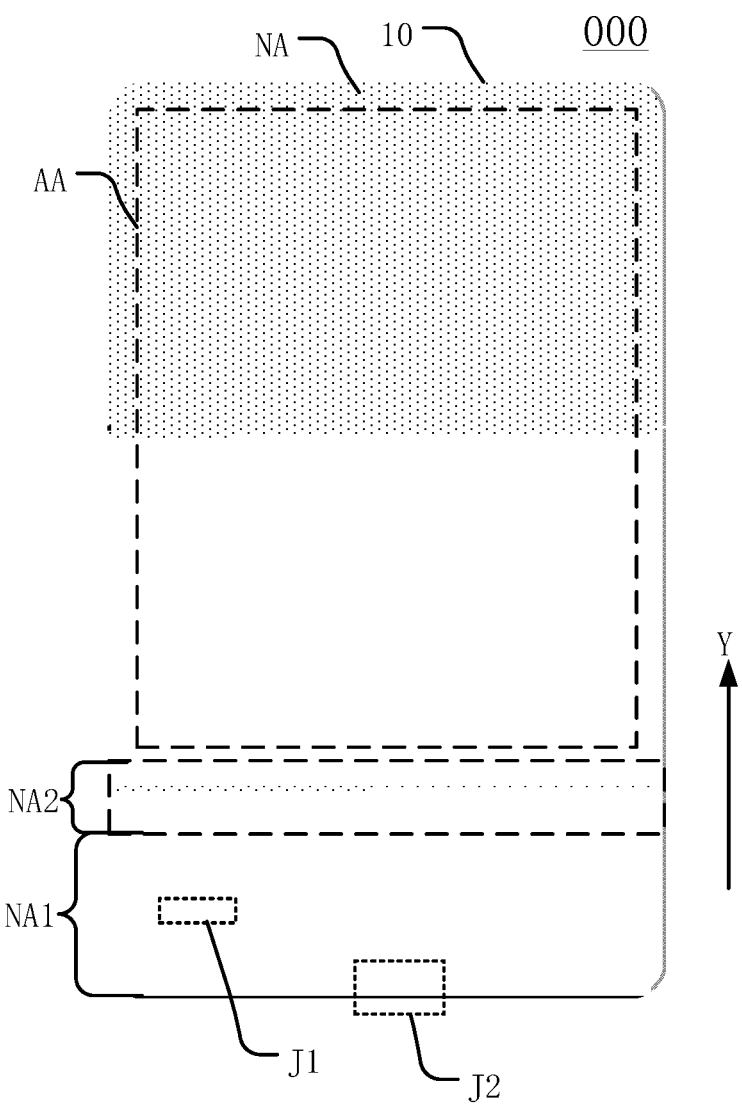
FIG. 2 illustrates a schematic plan view of the display panel in FIG. 1 before bending, consistent with the disclosed embodiments of the present disclosure.
Figure 3:
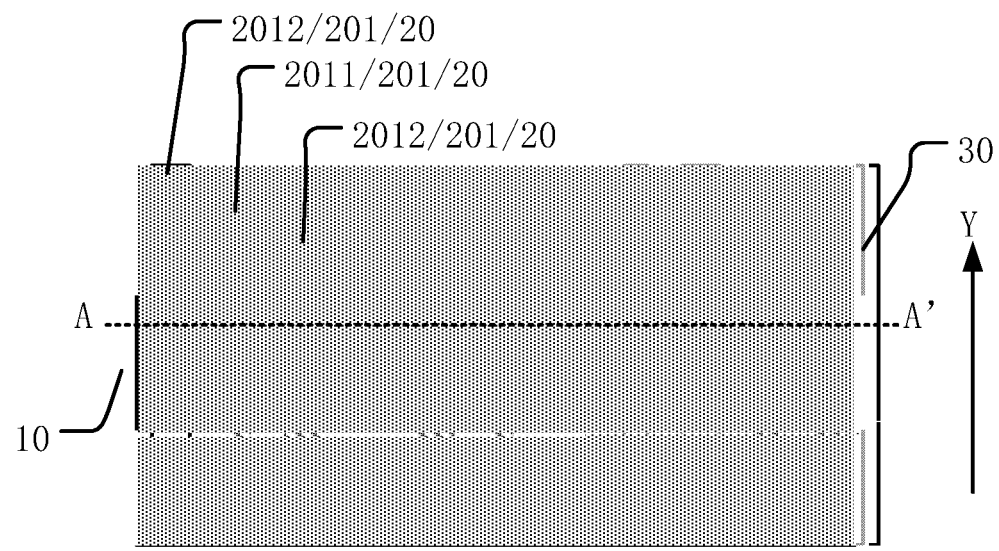
FIG. 3 illustrates a partial enlarged view of the J1 area in FIG. 2, consistent with the disclosed embodiments of the present disclosure.
Figure 4:
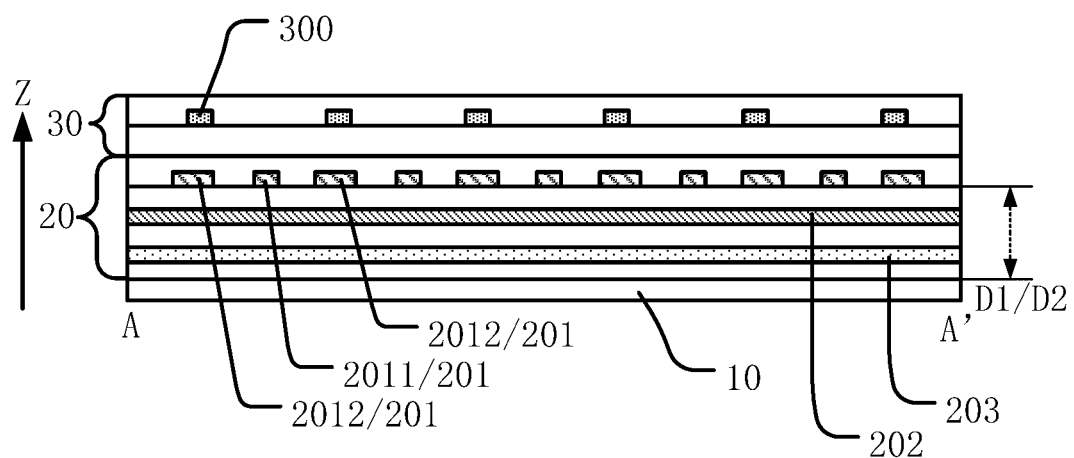
FIG. 4 illustrates a schematic cross-sectional structural diagram along the A-A' direction in FIG. 3, consistent with the disclosed embodiments of the present disclosure.

The present disclosure provides a display panel. FIG. 1 illustrates a schematic plan view of a display panel consistent with the disclosed embodiments of the present disclosure. FIG. 2 illustrates a schematic plan view of the display panel in FIG. 1 before bending. FIG. 3 illustrates a partial enlarged view of the J1 area in FIG. 2. FIG. 4 illustrates a schematic cross-sectional structural diagram along the A-A' direction in FIG. 3. It may be understood that, to illustrate the structure of the display panel, transparency filling is made in FIGS. 1-3. Referring to FIGS. 1-4, in one embodiment, the display panel 000 includes a display area AA and a non-display area NA. The non-display area NA includes a bending area NA2 and a first area NA1. Along a first direction Y, the first area NA1 is located on a side of the bending area NA2 away from the display area AA.

The display panel 000 includes a substrate 10, a driving array layer 20 disposed on a side of the substrate 10, and a touch function layer 30. The touch function layer 30 is disposed on a side of the driving array layer 20 away from the substrate 10. The driving array layer 20 at least includes a first metal layer 201. No other metal layers are disposed between the first metal layer 201 and the touch function layer 30.

In the first area NA1, the first metal layer 201 includes a plurality of first touch signal lines 2011 and a plurality of first fixed potential signal lines 2012. At least one first fixed potential signal line 2012 is disposed between two adjacent first touch signal lines 2011.

Specifically, in one embodiment, the display panel 000 is a flexible organic light-emitting display panel. The display panel 000 includes the display area AA and the non-display area NA. The non-display area NA includes the bending area NA2 and the first area NA1. Along the first direction Y, the first area NA1 is disposed on the side of the bending area NA2 away from the display area AA. An end of the first area NA1 away from the bending area NA2 may be used to bind a flexible printed circuit (FPC, not shown in FIG. 2). The flexible circuit board may be used to provide the display panel 000 with signals for display driving. After the display panel 000 in the bending area NA2 is bent, the first area NA1 and the flexible circuit board subsequently bound to the first area NA1 may be bent toward a side away from a light-emitting surface of the display panel 000 (as shown in FIG. 1). Accordingly, a size of a lower border of the display panel 000 may be reduced, a screen-to-body ratio may be increased, and a narrow border design of the panel may be achieved.

In one embodiment, a film layer structure of the display panel 000 includes a substrate 10. The substrate 10 may be used as a carrier to carry other film layer structures of the display panel 000. The substrate 10 may be a flexible substrate. The present disclosure does not limit a material of the substrate 10, as long as the substrate is made of a flexible material. A driving array layer 20 is disposed on one side of the substrate 10. The driving array layer 20 may include a gate metal layer, a source/drain metal layer, an active layer and other conductive film layers. The driving array layer 20 may also include an insulating layer between each conductive film layer. The conductive film layers and the insulating layers may be used to make pixel circuits, driving signal lines, etc. (not shown in FIGS. 1-4) that drive light-emitting devices in the display panel 000 to emit light. A touch function layer 30 may be disposed on a side of the driving array layer 20 away from the substrate 10. The touch function layer 30 may be used to set up structures such as touch signal lines that implement touch detection functions. The present disclosure does not limit a specific structure of the touch function layer 30. Details may be understood with reference to structures of touch display panels in the related art.

Optionally, in one embodiment, other film layers may be disposed between the driving array layer 20 and the touch function layer 30, such as a pixel definition layer, a light-emitting device layer, and a thin film encapsulation layer (not shown in FIGS. 1-4). The present disclosure does not elaborate on the film layer structure of the display panel 000. For details, reference may be made to structures of flexible OLED display panels in the related art.

In one embodiment, the display panel 000 is a flexible OLED display panel. A luminescence principle of the display panel may include that, when driven by an electric field, an organic luminescent material may emit light through carrier injection and recombination. Specifically, an OLED light-emitting device in the light-emitting device layer may use an indium tin oxide (ITO) electrode and a metal electrode as an anode and a cathode of the device respectively. Driven by a certain voltage, electrons and holes may be injected from the cathode and the anode respectively into an electron transport layer and a hole transport layer of the OLED light-emitting device. The electrons and the holes may migrate to a luminescent layer of the OLED light-emitting device through the electron transport layer and the hole transport layer respectively, and meet in the luminescent layer to form excitons. The excitons may excite luminescent molecules, and the luminescent molecules may emit visible light by radiative relaxation.

In one embodiment, a manufacturing process of the display panel 000 may include: first, on one side of the substrate 10, disposing the driving array layer 20 and other layers that may realize display functions, including a pixel definition layer, a light-emitting device layers, and a thin film encapsulation layer; then, forming the touch function layer 30 on one side of the thin film encapsulation layer to realize the display function and the touch detection function of the display panel 000.

In existing technology, touch lines of the touch function layer are generally made of the touch function layer itself. As such, a spacing between adjacent touch lines in the touch function layer may be small (the greater the touch precision, the greater the quantity of touch lines, and the smaller the spacing). In addition, the touch lines are basically at a same horizontal position. During touch signal transmission, adjacent signals may not be shielded, and capacitive coupling may exist between adjacent touch lines. As such, a coupling capacitance may exist on a channel of a single touch line, and a signal on one touch line may affect a signal on another touch line due to coupling. In this way, the signal transmitted by a touch line may be affected by adjacent lines of the touch line. Capacitance on a single touch line channel may be affected. As a result, a deviation in the detection capacitance may appear, and the touch detection effect may be affected. Technicians in the art may set up an additional shielding structure between adjacent touch lines on the touch function layer in to improve touch accuracy. However, the additional shielding structure may complicate the panel structure. As such, production efficiency and structural simplicity of the display panel may be affected.

To solve the above problem, in one embodiment, the driving array layer 20 at least includes a first metal layer 201. No other metal layers are disposed between the first metal layer 201 and the touch function layer 30. That is, among the conductive metal layers of the driving array layer 20, the first metal layer 201 may be understood as a metal layer that is closest to the touch function layer 30. In one embodiment, in the first area NA1, that is, at the side of the bending area NA2 of the display panel 000 away from the display area AA, the first metal layer 201 includes a plurality of first touch signal lines 2011 and a plurality of first fixed potential signal lines 2012. The plurality of first touch signal lines 2011 may be used to transmit touch signals to realize the touch detection function of the panel. That is, the plurality of first touch signal lines 2011 originally on the touch function layer 30 may be disposed on the first metal layer 201.

Disposing the plurality of first touch signal lines 2011 on the first metal layer 201 closest to the touch function layer 30 may provide the touch function layer 30 with a larger space for laying other touch signal lines. For example, when the touch accuracy of the display panel 000 requires 10,000 touch signal lines, half of the quantity of the touch signal lines may be disposed on the first metal layer 201 in the driving array layer 20 that is closest to the touch function layer 30, as the first touch signal lines 2011. Only half of the original quantity of touch signal lines need to be disposed on the touch function layer 30. Accordingly, the spacing between adjacent touch signal lines (touch signal lines 300 shown in FIG. 4) in the touch function layer 30 may be increased. Thus, the interference problem caused by capacitive coupling in the touch function layer 30 may be eased.

At least one first fixed potential signal line 2012 is disposed between two adjacent first touch signal lines 2011 of the first metal layer 201. The first fixed potential signal line 2012 may be a signal line originally disposed in the driving array layer 20 for transmitting a fixed potential, such as a power signal line used for transmitting power signals for the pixel circuit in the display panel 000. By utilizing the signal stability of the first fixed potential signal line 2012 that transmits a fixed potential, coupling interference between two adjacent first touch signal lines 2011 in the first metal layer 201 may be shielded. In addition, since the first fixed potential signal line 2012 originally included in the display panel 000 is used as a shielding structure, the panel does not need to have an additional shielding structure. As such, production efficiency and structural simplicity of the display panel may be improved.

In one embodiment, to achieve a narrow frame design, the display panel 000 adopts a COF bending structure. That is, after the display panel 000 in the bending area NA2 is bent, the first area NA1 and the flexible circuit board subsequently bound to the first area NA1 are bent toward a side away from a light-emitting surface of the display panel 000. To improve the luminous effect of the light-emitting device layer in the display area AA, a thin film encapsulation layer is generally required at least in the display area AA to isolate water and oxygen, such that the light-emitting device layer may have a good sealing and encapsulation effect. Accordingly, in the display area AA before the bending area NA2 of the panel, due to the flexible film encapsulation layer, line replacement by drilling holes may be difficult. To improve the bending effect, the film encapsulation layer is generally not disposed in the bending area NA2 and the first area NA1. That is, in the first area NA1 after the bending area NA2, since there is no thin film encapsulation layer, fewer spacing film layers may be disposed between the touch function layer 30 and the first metal layer 201. As such, line replacement in different layers may be realized relatively simply between the film layers in the first area NA1. In one embodiment, in the first area NA1, a part of the first touch signal line 2011 originally located on the touch function layer 30 may be disposed in the first metal layer 201 of the driving array layer 20. Accordingly, the effect of line replacement in different layers may also be better achieved, and the difficulty of line replacement caused by the packaging layer when replacing lines in the display area AA may be avoided. As such, disposing the first touch signal line 2011 in the first area NA1 on the first metal layer 201 may not increase the difficulty of the manufacturing process.

In one embodiment, the conductive metal layer closest to the touch function layer 30 in the driving array layer 20 may be set as the first metal layer 201. In the first area NA1 without the flexible packaging layer, a plurality of first touch signal lines 2011 may be disposed in the first metal layer 201. The difficulty of replacing the touch signal lines from the touch function layer 30 to the first metal layer 201 may be reduced, and the difficulty of the manufacturing process may be reduced. After the plurality of first touch signal lines 2011 is disposed in the first metal layer 201, the problem of coupling interference between touch signal lines originally included in the touch function layer 30 may be eased.

The first metal layer 201 may be disposed with the plurality of first fixed potential signal lines 2012 required by the panel. At least one first fixed potential signal line 2012 is disposed between two adjacent first touch signal lines 2011. The coupling interference between the two adjacent first touch signal lines 2011 may be shielded by the first fixed potential signal line 2012. Accordingly, overall touch detection performance of the panel may be improved. Since the first fixed potential signal line 2012 is a structure originally included in the panel, the manufacturing process and panel structure may not be increased. Accordingly, the production efficiency and structural simplicity of the display panel may be improved, and the overall touch detection performance of the panel may be improved.

It may be understood that FIGS. 1-4 only illustrate the film structure of the display panel. During specific implementation, the film layer structure of the display panel may include but is not limited to the configurations shown in FIGS. 1-4. The film structure may also include other structures that may realize the display function, such as pixel circuit structures, insulation layers, passivation layers, buffer layers and other film layer structures in the driving array layer 20. Details may be understood with reference to structures of display panels in the related art, and will not be elaborated here.

Figure 5:
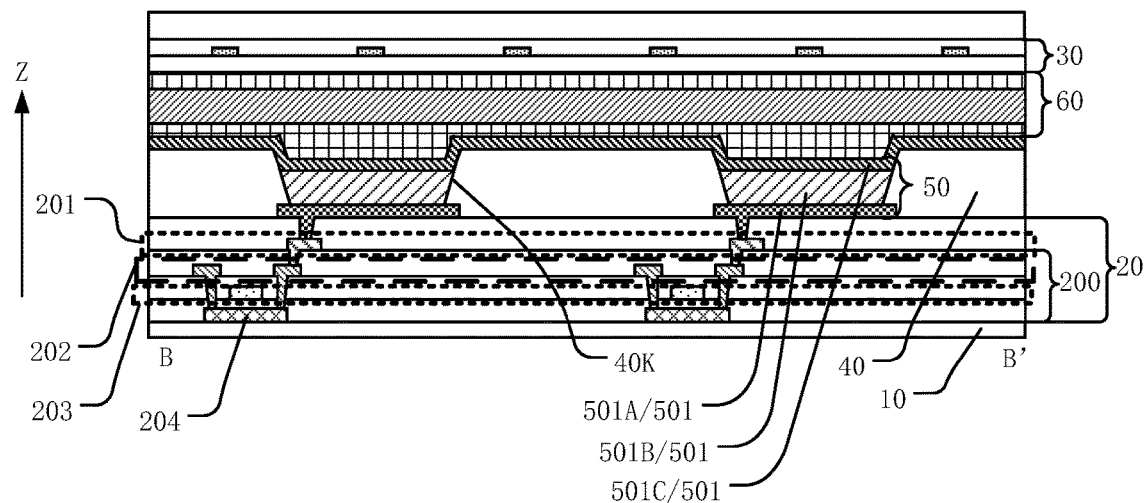
FIG. 5 illustrates a schematic diagram of a film structure of B-B' in FIG. 1, consistent with the disclosed embodiments of the present disclosure.

FIG. 5 illustrates a schematic diagram of a film structure of B-B' in FIG. 1. As shown in FIGS. 1, 2, and 5, to illustrate the film structure of the display panel 000, the film structure in the display area AA is schematically illustrated, such that the positions of the first metal layer 201 and the touch function layer 30 in the display area AA may be understood. In one embodiment, the film layer structure at the display area AA of the display panel 000 at least includes a substrate 10, a driving array layer 20, a pixel definition layer 40, a light emitting device layer 50, a thin film encapsulation layer 60, and a touch function layer 30. Optionally, the driving array layer 20 includes a thin film transistor array layer 200. The first metal layer 201 is disposed on a side of the thin film transistor array layer 200 away from the substrate 10. That is, the driving array layer 20 may include the first metal layer 201 closest to the touch function layer 30. The driving array layer 20 may also include other metal layers, such as the thin film transistor array layer 200 including a second metal layer 202, a third metal layer 203, and an active layer 204. The thin film transistor array layer 200 may be used for forming a pixel circuit including a thin film transistor array on the driving array layer 20. The plurality of metal layers of the driving array layer 20 may be used to make a gate, source/drain, and active layer of a thin film transistor, as well as signal lines and other structures connected to the pixel circuit. The present disclosure does not limit applications of the metal layers of the driving array layer 20.

The pixel definition layer 40 may include a plurality of openings 40K, and the light emitting device layer 50 may include a plurality of light emitting devices 501. Along a direction Z perpendicular to a plane of the substrate 10, the opening 40K penetrates the thickness of the pixel definition layer 40. The pixel definition layer 40 may be used to define the placement position of each light-emitting device 501 of the light-emitting device layer 50. That is, the light-emitting device 501 is disposed in the opening 40K. Each opening 40K may be used to dispose the light-emitting device 501 of the light-emitting device layer 50. An orthographic projection of the light emitting device 501 on a light emitting surface of the display panel 000 and an orthographic projection of the opening 40K on the light emitting surface of the display panel 000 may overlap with each other.

The light-emitting device 501 may be an organic light-emitting diode. Each light-emitting device 501 includes a first electrode 501A, a light-emitting part 501B and a second electrode 501C. The a first electrode 501A is located on a side close to the substrate 10. Each opening 40K of the pixel definition layer 40 may be used to expose the first electrode 501A of the light-emitting device 501. The first electrode 501A may be an anode, and the second electrode 501C may be a cathode. When current passes through the first electrode 501A and the second electrode 501C and forms an electric field between the first electrode 501A and the second electrode 501C, the light-emitting part 501B may emit light. The light-emitting principle of the light-emitting device 501 may be understood with reference to structures and principles of organic light-emitting devices in the related art, and will not be elaborated here.

The thin film encapsulation layer 60 may be a stack structure of a plurality of film layers including inorganic layers and organic layers. In the first area NA1 of the non-display area NA, a plurality of layers of the display area AA, such as the thin film encapsulation layer, the light-emitting device layer, and the pixel definition layer, may not be needed. For positions of the first metal layer 201 and the touch function layer 30, reference may be made to FIG. 4. The film layer structure of FIG. 4 may reduce difficulty of replacing the touch signal lines from the touch function layer 30 to the first metal layer 201, and reduce difficulty of the manufacturing process.

Optionally, in one embodiment, the first touch signal line 2011 and the first fixed potential signal line 2012 each extend along the first direction Y. Since the first area NA1 is located on the side of the bending area NA2 away from the display area AA, the end of the first area NA1 away from the bending area NA2 may be subsequently used to bind the flexible circuit board. After the display panel 000 in the bending area NA2 is bent, the first area NA1 and the flexible circuit board subsequently bound to the first area NA1 may be bent toward a side away from a light-emitting surface of the display panel 000. The first touch signal line 2011 and the first fixed potential signal line 2012 each extend along the first direction Y to the end of the first area NA1 away from the bending area NA2, such that electrical connection with pins of the flexible circuit board subsequently bound to the first area NA1 may be made. The flexible circuit board may be used to provide driving signals for the first touch signal line 2011 and the first fixed potential signal line 2012.

It may be understood that the extension along the first direction Y in the above embodiment only means that an overall extension direction of the signal line is the first direction Y. The signal line itself may have certain bends, such as a bending structure similar to a fan-out line in related technologies, such that the panel may achieve a narrow frame effect, as long as the overall extension of the signal line extends in the first direction Y. For details, reference may be made to the arrangement of signal lines electrically connected to the pins of the flexible circuit board in the related art, and will not be elaborated.

Optionally, in one embodiment, the display area AA of the display panel 000 may include a pixel circuit. The pixel circuit is electrically connected to the light-emitting device 501 of the light-emitting device layer 50. The pixel circuit may be an electrical connection structure including a plurality of transistors and capacitors in the related art, and may be used for fabricating the driving array layer 20. In one embodiment, in the display panel 000, the first fixed potential signal line 2012 located in the first metal layer 201 may be either a positive power supply signal line or a negative power supply signal line electrically connected to the pixel circuit. The positive power supply signal line or the negative power supply signal line are lines that transmit stable potential signals. Accordingly, by multiplexing the power signal line originally included in display panel 000 as the shielding structure between the first touch signal lines 2011 of the first metal layer 201, the panel structure may be simplified, and touch detection performance may be improved.

Optionally, in one embodiment, the first fixed potential signal line 2012 used to shield the capacitive coupling interference between two adjacent first touch signal lines 2011 in the first metal layer 201 may be a negative power signal line originally included in the display panel 000. The negative power signal required by the pixel circuit of the display panel 000 is relatively stable. In addition, in the touch detection of self-capacitance technology, the self-capacitance detected is the capacitance to the cathode, that is, the capacitance to the negative power signal. Accordingly, the capacitance of the first touch signal line 2011 to the first fixed potential signal line 2012 that transmits the negative power signal may also be used to increase the capacitance detected on the single first touch signal line 2011. As such, the touch detection signal may be easily read and detected, and the touch detection performance may be improved.

Still referring to FIGS. 1-4, in one embodiment, along the direction Z perpendicular to the plane of the substrate 10, a spacing D1 from the first touch signal line 2011 to the substrate 10 is equal to a spacing D2 from the first fixed potential signal line 2012 to the substrate 10.

In one embodiment, the first touch signal line 2011 is disposed on the first metal layer 201. Through the stacking control of the film layers under the first metal layer 201, in the direction Z perpendicular to the plane of the substrate 10, the spacing D1 from the first touch signal line 2011 to the substrate 10 and the spacing D2 from the first fixed potential signal line 2012 to the substrate 10 may be made to be equal. That is, the first touch signal line 2011 and the first fixed potential signal line 2012 may be basically on a same horizontal plane.

Figure 6:
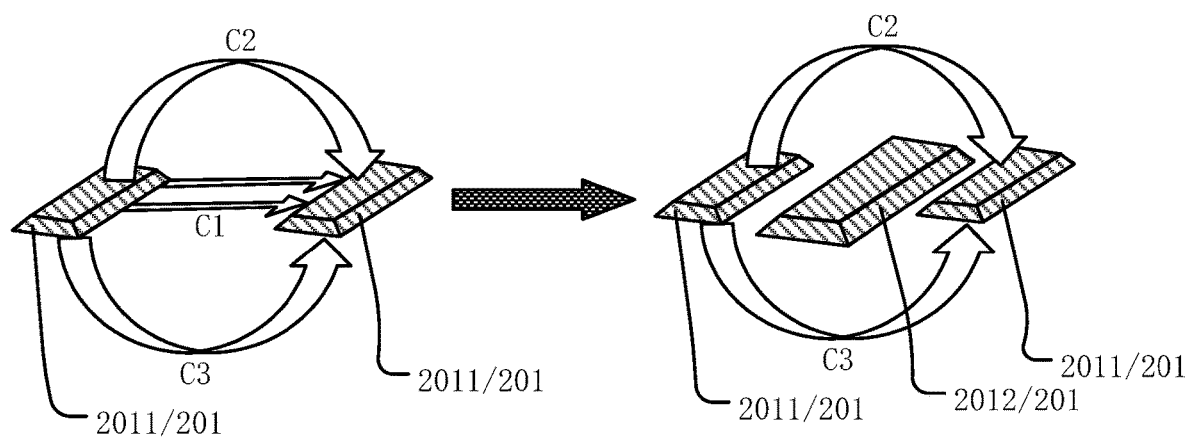
FIG. 6 illustrates a comparison diagram between the capacitive coupling between two adjacent first touch signal lines in existing technology and the capacitive coupling between two adjacent first touch signal lines in FIG. 4 of the present disclosure.

FIG. 6 illustrates a comparison diagram between the capacitive coupling between two adjacent first touch signal lines in existing technology and the capacitive coupling between two adjacent first touch signal lines in FIG. 4 of the present disclosure. As shown on the left side of FIG. 6, in existing technology, the capacitance that exists between the two adjacent first touch signal lines 2011 includes a facing capacitance C1, an upper lateral capacitance C2, and a lower lateral capacitance C3. The facing capacitance C1 may be understood as the coupling capacitance generated between two adjacent first touch signal lines 2011 in the lateral horizontal direction. The upper lateral capacitance C2 may be understood as the coupling capacitance above the first metal layer 201 generated by two adjacent first touch signal lines 2011. The lower lateral capacitance C3 may be understood as the coupling capacitance below the first metal layer 201 generated by two adjacent first touch signal lines 2011. As shown on the right side of FIG. 6, in one embodiment, at least one first fixed potential signal line 2012 is disposed between two adjacent first touch signal lines 2011. The spacing D1 from the first touch signal line 2011 to the substrate 10 and the spacing D2 from the first fixed potential signal line 2012 to the substrate 10 are set to be equal. The first fixed potential signal line 2012 transmitting a fixed potential may at least shield the facing capacitance between two adjacent first touch signal lines 2011. Accordingly, the interference degree of coupling capacitance between two adjacent first touch signal lines 2011 of the first metal layer 201 may be reduced, and touch detection accuracy and touch performance may be improved.

Figure 7:
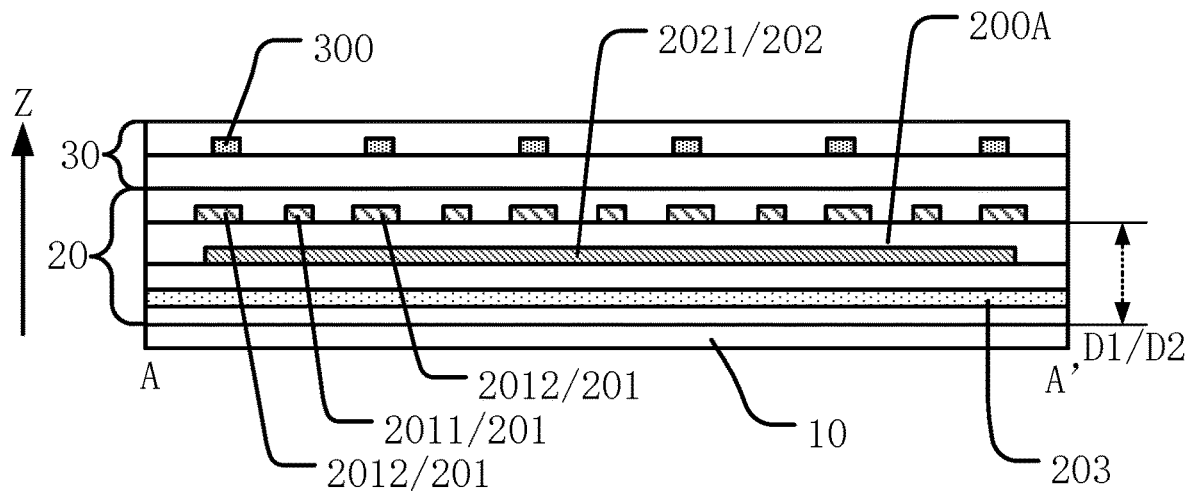
FIG. 7 illustrates another schematic cross-sectional structural diagram along the A-A' direction in FIG. 3, consistent with the disclosed embodiments of the present disclosure.

FIG. 7 illustrates another schematic cross-sectional structural diagram along the A-A' direction in FIG. 3, consistent with the disclosed embodiments of the present disclosure. Referring to FIGS. 1-3 and 7, in one embodiment, the driving array layer 20 also includes a second metal layer 202. The second metal layer 202 is disposed on a side of the first metal layer 201 close to the substrate 10. A first insulating layer 200A is disposed between the first metal layer 201 and the second metal layer 202.

The second metal layer 202 includes a plurality of second metal parts 2021. The first fixed potential signal line 2012 is electrically connected to the second metal part 2021 (the electrical connection is not shown in FIG. 7).

In one embodiment, in the film structure of display panel 000, the driving array layer 20 may also include a second metal layer 202 disposed on a side of the first metal layer 201 close to the substrate 10. The first metal layer 201 and the second metal layer 202 are insulated by a first insulating layer 200A. The first insulating layer 200A may also play a flattening effect on the structure of the second metal layer 202. Through the first insulating layer 200A, the spacing D1 between the first touch signal line 2011 and the substrate 10 may be made to be equal to the spacing D2 between the first fixed potential signal line 2012 and the substrate 10 as much as possible. Accordingly, the shielding effect of the first fixed potential signal line 2012 on the facing capacitance between two adjacent first touch signal lines 2011 may be improved.

In one embodiment, a plurality of second metal parts 2021 may be disposed on the second metal layer 202. The second metal part 2021 is electrically connected to the first fixed potential signal line 2012. That is, in addition to forming a plurality of structures of the transistors in the driving array layer 20, such as source/drain electrodes of the transistors, the second metal layer 202 may also form the second metal part 2021 in the free space in the first area NA1. The second metal part 2021 is electrically connected to the first fixed potential signal line 2012 of the first metal layer 201. The first fixed potential signal line 2012 may be configured as a parallel structure in different layers through conductive structures arranged in different layers. As such, the overall impedance of the first fixed potential signal line 2012 may be reduced, and the transmission effect and transmission stability of the fixed potential on the first fixed potential signal line 2012 may be improved.

Figure 8:
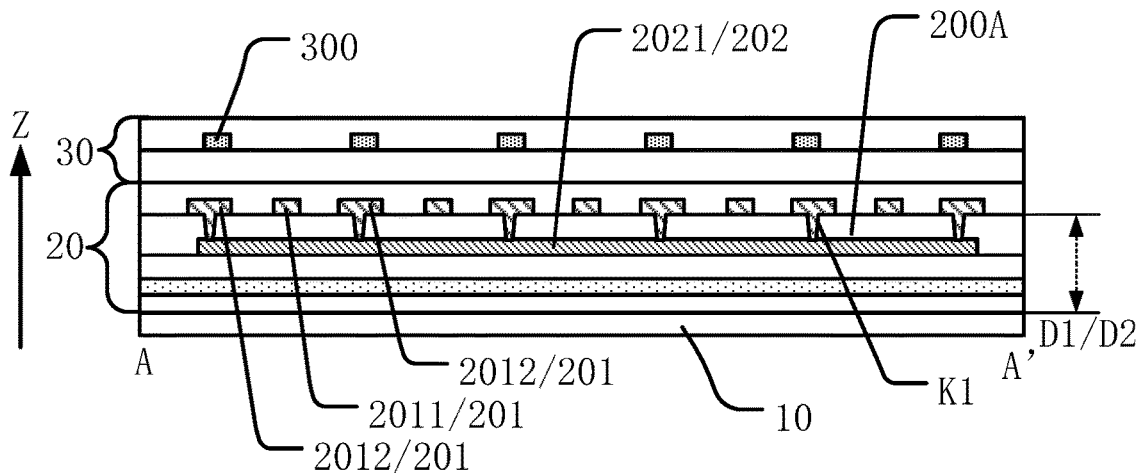
FIG. 8 illustrates another schematic cross-sectional structural diagram along the A-A' direction in FIG. 3, consistent with the disclosed embodiments of the present disclosure.

FIG. 8 illustrates another schematic cross-sectional structural diagram along the A-A' direction in FIG. 3, consistent with the disclosed embodiments of the present disclosure. Referring to FIGS. 1-3, and 8, in one embodiment, the first fixed potential signal line 2012 and the second metal part 2021 are electrically connected through a plurality of first vias K1. The first via K1 penetrates a thickness of the first insulating layer 200A. As such, the electrical connection between the first fixed potential signal line 2012 and the second metal part 2021 arranged in different layers may be achieved through the plurality of first vias K1 opened in the first insulating layer 200A. Accordingly, the first fixed potential signal line 2012 of the first metal layer 201 may be partially filled into the first via K1 and then be electrically connected to the second metal part 2021 of the second metal layer 202. Due to existence of the first insulating layer 200A, the first fixed potential signal line 2012 of the first metal layer 201 and the first touch signal line 2011 are at a same level as much as possible. The coupling interference of the facing capacitance between two adjacent first touch signal lines 2011 may be shielded.

Figure 9:
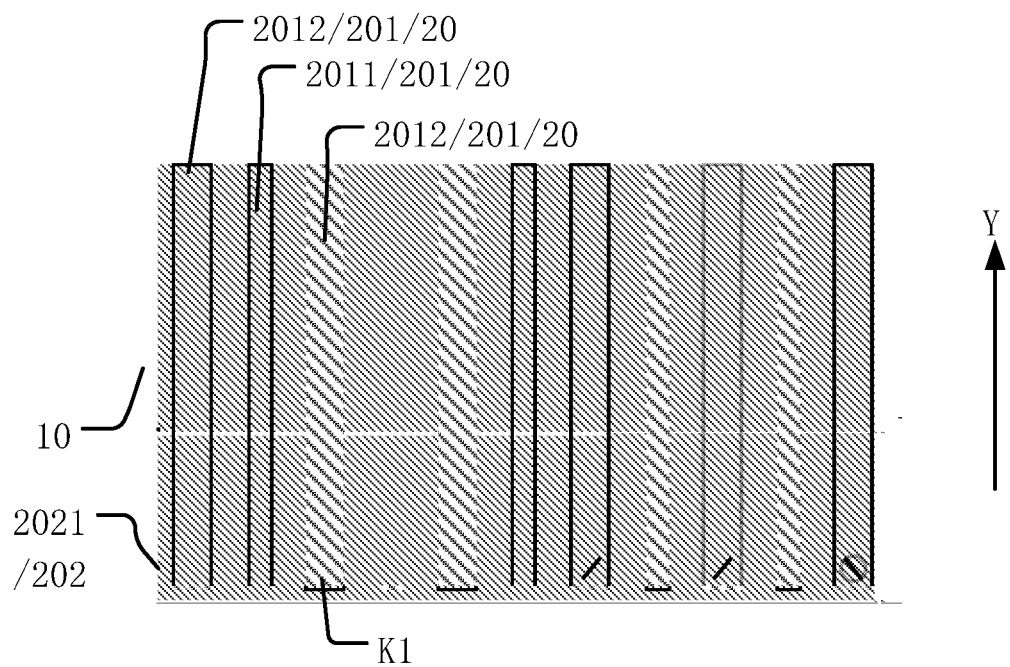
FIG. 9 illustrates a partial enlarged view of the J2 area in FIG. 2, consistent with the disclosed embodiments of the present disclosure.

FIG. 9 illustrates a partial enlarged view of the J2 area in FIG. 2, consistent with the disclosed embodiments of the present disclosure. It may be understood that, to illustrate the structure, transparency filling is made in FIG. 9. Referring to FIGS. 1, 2, 8 and 9, in one embodiment, at least part of the first vias K1 is located at the periphery of the first area NA1. The first fixed potential signal line 2012 may be a double-layer electrical connection structure of the first metal layer 201 and the second metal layer 202. The first via K1 that electrically connects the first fixed potential signal line 2012 of the first metal layer 201 and the second metal part 2021 of the second metal layer 202 may be partially or entirely located on the periphery of the first area NA1, that is, as close to the frame area of the display panel 000 as possible. Since part of the first metal layer 201 may be used for disposing the first touch signal line 2011, the space used for opening the first via K1 to electrically connect the first fixed potential signal line 2012 and the second metal part 2021 may become smaller. As such, at least part of the first vias K1 may be opened in the frame area of the display panel 000. The possibility of interference to the first touch signal line 2011 by opening the first via K1 may be reduced, and the signal transmission stability of the first touch signal line 2011 may be improved.

Still referring to FIGS. 1, 2, 8 and 9, in one embodiment, the second metal part 2021 located on the second metal layer 202 and electrically connected to the first fixed potential signal line 2012 of the first metal layer 201 may be an entire-surface structure. An orthographic projection of the second metal portion 2021 on the substrate 10 covers orthographic projections of the plurality of first touch signal lines 2011 on the substrate 10. The possible interference of the lower film layer on the first touch signal line 2011 may be shielded by the second metal part 2021 with an entire-surface structure and connected to a fixed potential.

Figure 10:
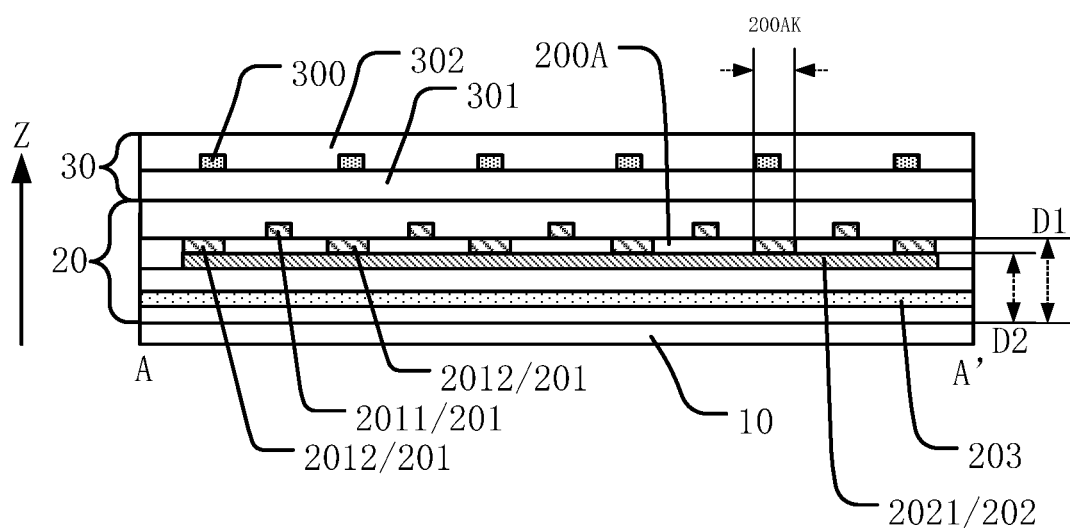
FIG. 10 illustrates another schematic cross-sectional structural diagram along the A-A' direction in FIG. 3, consistent with the disclosed embodiments of the present disclosure.

FIG. 10 illustrates another schematic cross-sectional structural diagram along the A-A' direction in FIG. 3, consistent with the disclosed embodiments of the present disclosure. Referring to FIGS. 1-3, and 10, in one embodiment, along the direction Z perpendicular to the plane of the substrate 10, the spacing D1 from the first touch signal line 2011 to the substrate 10 may be greater than the spacing D2 from the first fixed potential signal line 2012 to the substrate 10.

In one embodiment, the first touch signal line 2011 is disposed on the first metal layer 201. Through the stacking control of the film layers below the first metal layer 201, along the direction Z perpendicular to the plane of the substrate 10, the spacing D1 from the first touch signal line 2011 to the substrate 10 may be made to be greater than the spacing D2 from the first fixed potential signal line 2012 to the substrate 10. That is, although the first touch signal line 2011 and the first fixed potential signal line 2012 are each made of the first metal layer 201 (shown with a same pattern filling in FIG. 10), the first touch signal line 2011 and the first fixed potential signal line 2012 may be not at a same level.

Figure 11:
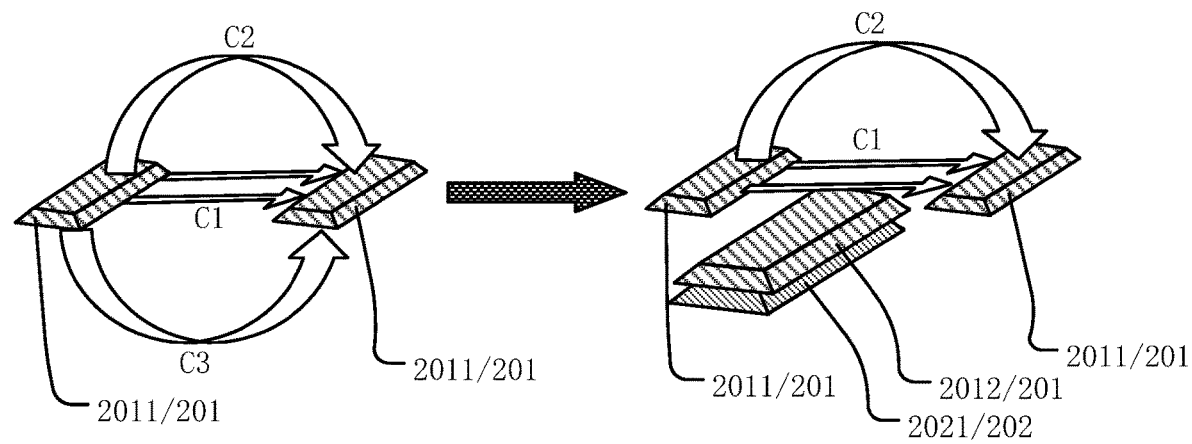
FIG. 11 illustrates a comparison diagram between the capacitive coupling between two adjacent first touch signal lines in existing technology and the capacitive coupling between two adjacent first touch signal lines in FIG. 10 of the present disclosure.

FIG. 11 illustrates a comparison diagram between the capacitive coupling between two adjacent first touch signal lines in existing technology and the capacitive coupling between two adjacent first touch signal lines in FIG. 10 of the present disclosure. As shown on the left side of FIG. 11, in existing technology, the capacitance that exists between the two adjacent first touch signal lines 2011 includes a facing capacitance C1, an upper lateral capacitance C2, and a lower lateral capacitance C3. The facing capacitance C1 may be understood as the coupling capacitance generated between two adjacent first touch signal lines 2011 in the lateral horizontal direction. The upper lateral capacitance C2 may be understood as the coupling capacitance above the first metal layer 201 generated by two adjacent first touch signal lines 2011. The lower lateral capacitance C3 may be understood as the coupling capacitance below the first metal layer 201 generated by two adjacent first touch signal lines 2011. As shown on the right side of FIG. 11, in one embodiment, at least one first fixed potential signal line 2012 is disposed between two adjacent first touch signal lines 2011. The spacing D1 from the first touch signal line 2011 to the substrate 10 may be set to be greater than the spacing D2 from the first fixed potential signal line 2012 to the substrate 10. The lower lateral capacitance existing between two adjacent first touch signal lines 2011 may be shielded by the first fixed potential signal line 2012 that transmits a fixed potential. Accordingly, the interference degree of coupling capacitance between two adjacent first touch signal lines 2011 of the first metal layer 201 may be reduced, and touch detection accuracy and touch performance may be improved.

Optionally, as shown in FIGS. 1, 2, 3, and 10, the driving array layer 20 also includes the second metal layer 202. The second metal layer 202 is disposed on the side of the first metal layer 201 close to the substrate 10. The first insulating layer 200A is disposed between the first metal layer 201 and the second metal layer 202.

The first insulating layer 200A may include a plurality of hollow parts 200AK. An orthographic projection of the hollow part 200AK on the substrate 10 may overlap with the orthographic projection of the first fixed potential signal line 2012 on the substrate 10.

The second metal layer 202 includes a plurality of second metal parts 2021. In the hollow part 200AK, the first fixed potential signal line 2012 is in direct contact with the second metal part 2021.

In one embodiment, in the film layer structure of the display panel 000, the driving array layer 20 may also include a second metal layer 202 disposed on a side of the first metal layer 201 close to the substrate 10. The first metal layer 201 and the second metal layer 202 are insulated by the first insulating layer 200A. The first insulating layer 200A may not only flatten the structure of the second metal layer 202, but also adjust the spacing D2 from the first fixed potential signal line 2012 to the substrate 10. The spacing D1 between the first touch signal line 2011 and the substrate 10 may be made to be greater than the spacing D2 between the first fixed potential signal line 2012 and the substrate 10 as much as possible. Accordingly, the shielding effect of the first fixed potential signal line 2012 on the lower lateral capacitance between the two adjacent first touch signal lines 2011 may be improved.

Specifically, the first insulating layer 200A includes a plurality of hollow parts 200AK. The orthographic projection of the hollow part 200AK on the substrate 10 overlaps with the orthographic projection of the first fixed potential signal line 2012 on the substrate 10. The second metal layer 202 includes a plurality of second metal parts 2021. In the hollow part 200AK, the first fixed potential signal line 2012 and the second metal part 2021 are in direct contact in the hollow part 200AK to achieve electrical connection between the first fixed potential signal line 2012 and the second metal part 2021. During the manufacturing process, after the second metal part 2021 covered by the first insulating layer 200A is produced, the first insulating layer 200 at the position of the first fixed potential signal line 2012 of the original first insulating layer 200A may be hollowed out to form a hollow part 200AK, exposing part of the second metal part 2021. After the first touch signal line 2011 and the first fixed potential signal line 2012 of the first metal layer 201 are completed, the first fixed potential signal line 2012 may sink into the hollow part 200AK and be in direct contact and electrical connection with the second metal portion 2021.

In one embodiment, a plurality of second metal parts 2021 may be disposed on the second metal layer 202. The first fixed potential signal line 2012 may be in direct contact and electrical connection with the second metal part 2021 at the hollow part 200AK. That is, in addition to forming a plurality of structures of the transistors in the driving array layer 20, such as source/drain electrodes of the transistors, the second metal layer 202 may also form the second metal part 2021 in the free space in the first area NA1. The second metal part 2021 is electrically connected to the first fixed potential signal line 2012 of the first metal layer 201. The first fixed potential signal line 2012 may be configured as a parallel structure in different layers through conductive structures arranged in different layers. As such, the overall impedance of the first fixed potential signal line 2012 may be reduced, and the transmission effect and transmission stability of the fixed potential on the first fixed potential signal line 2012 may be improved.

Figure 12:
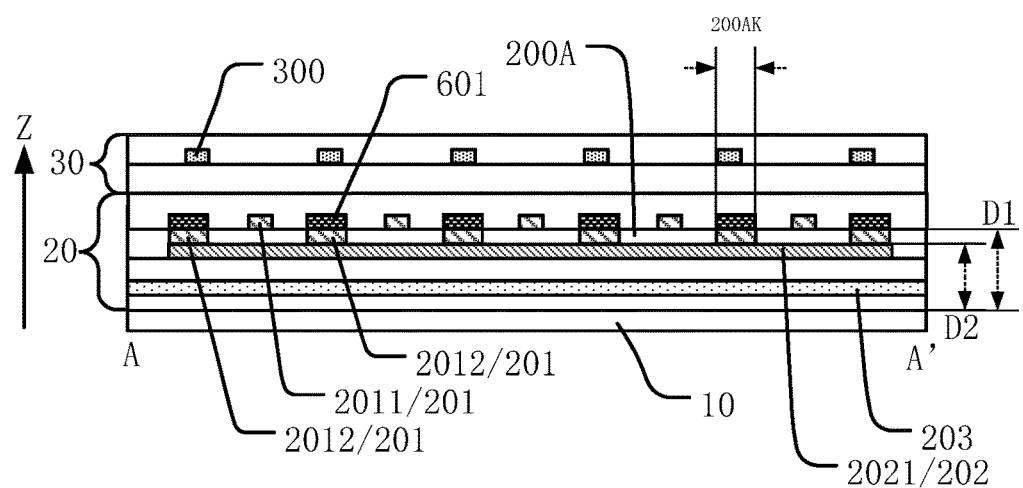
FIG. 12 illustrates another schematic cross-sectional structural diagram along the A-A' direction in FIG. 3, consistent with the disclosed embodiments of the present disclosure.

FIG. 12 illustrates another schematic cross-sectional structural diagram along the A-A' direction in FIG. 3, consistent with the disclosed embodiments of the present disclosure. Referring to FIGS. 1-3 and 12, in one embodiment, in the film layer structure of the display panel 000, a conductive compensation structure 601 may be disposed over the first fixed potential signal line 2012. A thickness of the compensation structure 601 may be increased such that the compensation structure 601 may have a same height as the first touch signal line 2011. As such, the thickness of the first fixed potential signal line 2012 in the direction Z perpendicular to the plane of the substrate 10 may be increased through the compensation structure 601. The compensation structure 601 and the first fixed potential signal line 2012 may be electrically connected to reduce impedance. The facing capacitances of two adjacent first touch signal lines 2011 may be shielded through the compensation structure 601. The lower lateral capacitance and the facing capacitance existing between the two adjacent first touch signal lines 2011 may be shielded by the first fixed potential signal line 2012 transmitting a fixed potential and the compensation structure 601. Accordingly, the interference degree of the coupling capacitance between two adjacent first touch signal lines 2011 of the first metal layer 201 may be reduced, and touch detection accuracy and touch performance may be improved.

It may be understood that in one embodiment, the compensation structure 601 disposed over the first fixed potential signal line 2012 is conductive, and may be made of any conductive layer in the driving array layer 20. The compensation structure 601 may also be made of the conductive film layer of the touch function layer 30. The present disclosure does not limit the conductive layer for making the compensation structure. For details, reference may be made to descriptions of subsequent embodiments.

Referring to FIGS. 1-3 and 10, in one embodiment, the touch function layer 30 at least includes a first protective layer 301 and a second protective layer 302 (not filled in FIG. 10). The second protective layer 302 is disposed on a side of the first protective layer 301 away from the substrate 10. The first protective layer 301 may be an inorganic layer, and the second protective layer 302 may be an organic layer.

In one embodiment, the touch function layer 30 of the display panel 000 may include at least the first protective layer 301 and the second protective layer 302. The second protective layer 302 is disposed on the side of the first protective layer 301 away from the substrate 10. The first protective layer 301 may be an inorganic layer. The second protective layer 302 may be an organic layer. The second protective layer 302 of organic layer material may be used to protect underlying film layers. However, the second protective layer 302 of organic layer material may not be waterproof and may have poor reliability. As such, when replacing the touch signal line 300 of the touch function layer 30 to the first metal layer 201, the first protective layer 301 needs to be provided under the second protective layer 302. The first protective layer 301 of inorganic layer material may be used to cover and protect the conductive structure (the first fixed potential signal line and the first touch signal line) of the first metal layer 201. Accordingly, reliability of the electrical connection between the structure of the first metal layer 201 and the touch signal line 300 of the touch function layer 30 may be improved.

Figure 13:
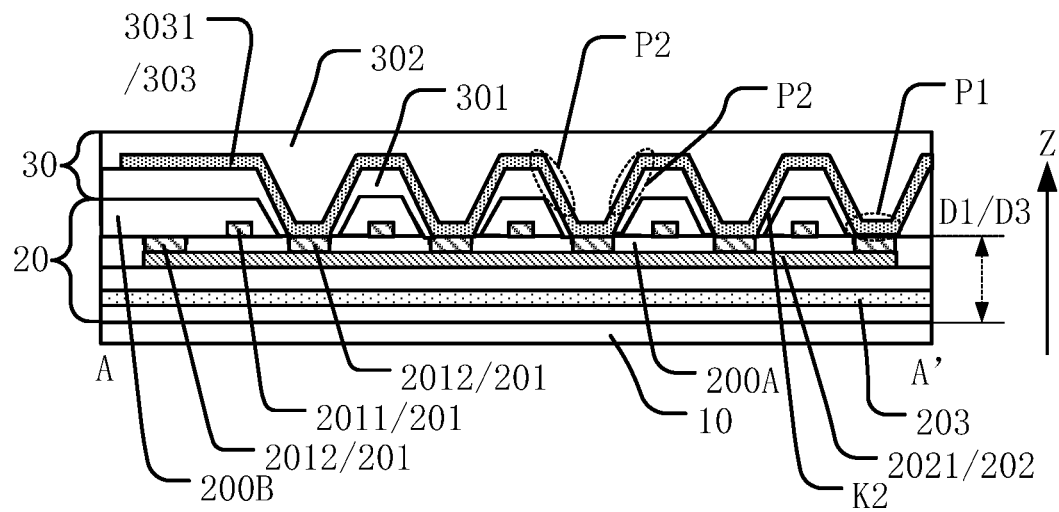
FIG. 13 illustrates another schematic cross-sectional structural diagram along the A-A' direction in FIG. 3, consistent with the disclosed embodiments of the present disclosure.

FIG. 13 illustrates another schematic cross-sectional structural diagram along the A-A' direction in FIG. 3, consistent with the disclosed embodiments of the present disclosure. Referring to FIGS. 1-3 and 13, in one embodiment, the touch function layer 300 includes a third metal layer 303. The third metal layer 303 is disposed between the first protective layer 301 and the second protective layer 302.

In the first area NA1, the third metal layer 303 includes a third metal part 3031, and the third metal part 3031 is an entire-surface structure. An orthographic projection of the third metal part 3031 on the substrate 10 covers the orthographic projection of the plurality of first touch signal lines 2011 on the substrate 10. The third metal part 3031 is electrically connected to the first fixed potential signal line 2012 through a second via K2.

In one embodiment, the touch function layer 30 may include a conductive third metal layer 303. The third metal layer 303 is located between the first protective layer 301 and the second protective layer 302. The third metal layer 303 may be used to dispose the third metal part 3031 with an entire-surface structure. Arranging each of the touch signal lines in the first metal layer 201 may avoid the problem of mutual coupling interference when the touch signal lines are arranged in the touch function layer 30. The conductive third metal layer 303 of the touch function layer 30 may be used to dispose the third metal part 3031 with an entire-surface structure. The orthographic projection of the third metal part 3031 on the substrate 10 covers the orthographic projection of the plurality of first touch signal lines 2011 on the substrate 10. That is, the area of the third metal part 3031 may be large enough, and no patterns are required.

The third metal part 3031 may be electrically connected to the first fixed potential signal line 2012 through the second via K2. The second via K2 may be a via that penetrates the insulating film layer between the third metal layer 303 and the first metal layer 201 (such as the first protective layer 301 and the second insulating layer 200B of the driving array layer 20). The third metal part 3031 may be electrically connected to the first fixed potential signal line 2012. As such, the overall impedance of the first fixed potential signal line 2012 may be reduced.

Referring to FIGS. 1-3 and 13, at least part of the third metal part 3031 is in direct contact with the first fixed potential signal line 2012 in the second via K2. The second via K2 may be used to expose at least part of the first fixed potential signal lines 2012. Accordingly, when fabricating the third metal layer 303, the third metal part 3031 may be deposited in the second via K2, and directly contacted and electrically connected to the first fixed potential signal line 2012 of the first metal layer 201.

Referring to FIGS. 1-3 and 13, along the direction Z perpendicular to the plane of the substrate 10, a spacing D3 from at least part of the third metal part 3031 to the substrate 10 is equal to the spacing D1 from the first touch signal line 2011 to the substrate 10.

In one embodiment, at least part of the third metal part 3031 is in direct contact with the first fixed potential signal line 2012 in the second via K2 to achieve electrical connection. The part of the third metal part 3031 that is in direct contact with the first fixed potential signal line 2012 may basically have a same height as the first touch signal line 2011. The coupling interference of the capacitance between two adjacent first touch signal lines 2011 of the first metal layer 201 may be shielded by the part of the third metal part 3031 (the part of the third metal part 3031 enclosed by a dotted line P1 in FIG. 13). The first fixed potential signal line 2012 of the first metal layer 201 may be lower than the first touch signal line 2011, such that the coupling interference of the lower lateral capacitance between the two adjacent first touch signal lines 2011 of the first metal layer 201 may be shielded.

The part of the third metal part 3031 that is not in direct contact with the first fixed potential signal line 2012 is equivalent to being directly above the first touch signal line 2011. Accordingly, the coupling interference of the upper lateral capacitance between the two adjacent first touch signal lines 2011 of the first metal layer 201 may be shielded by the part of the third metal part 3031 (the part of the third metal part 3031 enclosed by a dotted line P2 in FIG. 13) that is not in direct contact with the first fixed potential signal line 2012. As such, through effects of the third metal part 3031 located on the third metal layer 303 and the first fixed potential signal line 2012 located on the first metal layer 201, the coupling capacitive interference of two adjacent first touch signal lines 2011 in three directions may be shielded. Touch performance may thus be improved.

Figure 14:
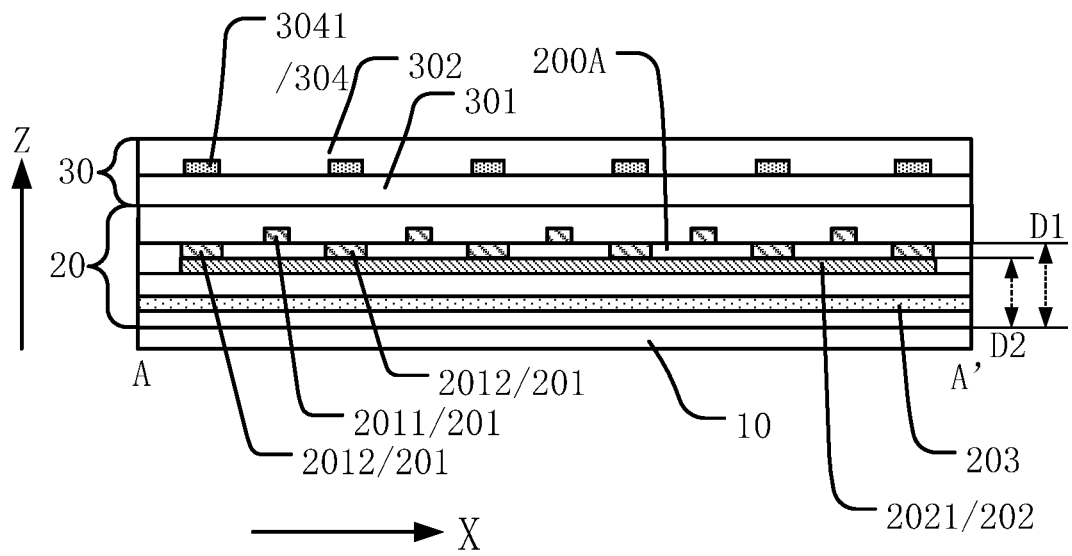
FIG. 14 illustrates another schematic cross-sectional structural diagram along the A-A' direction in FIG. 3, consistent with the disclosed embodiments of the present disclosure.

FIG. 14 illustrates another schematic cross-sectional structural diagram along the A-A' direction in FIG. 3, consistent with the disclosed embodiments of the present disclosure. Referring to FIGS. 1-3 and 14, in one embodiment, the touch function layer 300 includes a fourth metal layer 304. The fourth metal layer 304 is disposed between the first protective layer 301 and the second protective layer 302.

In the first area NA1, the fourth metal layer 304 includes a plurality of second touch signal lines 3041. An orthographic projection of the second touch signal line 3041 on the substrate 10 is located between orthographic projections of two adjacent first touch signal lines 2011 on the substrate 10. Optionally, the orthographic projection of the second touch signal line 3041 on the substrate 10 overlaps with the orthographic projection of the first fixed potential signal line 2012 on the substrate 10.

In one embodiment, the touch function layer 30 may include a conductive fourth metal layer 304. The fourth metal layer 304 is disposed between the first protective layer 301 and the second protective layer 302. The fourth metal layer 304 may be used to set the touch signal lines included in the touch function layer 30. Specifically, in the first area NA1, the fourth metal layer 304 may include a plurality of second touch signal lines 3041. Since the plurality of first touch signal lines 2011 is disposed on the first metal layer 201 of the driving array layer 20, on the premise that the total quantity of touch signal lines required for the display panel 000 remains unchanged, the quantity of second touch signal lines 3041 disposed on the touch function layer 30 may be reduced. Accordingly, the spacing between two adjacent second touch signal lines 3041 in the fourth metal layer 304 of the touch function layer may be increased. The mutual interference of the coupling capacitance between two adjacent second touch signal lines 3041 may be reduced. As such, the touch function layer 30 may have more space for laying the second touch signal line 3041, and the touch detection performance of the second touch signal line 3041 in the touch function layer 30 may be improved.

In one embodiment, the plurality of first touch signal lines 2011 is disposed in the first metal layer 201 of the driving array layer 20, and the plurality of second touch signal lines 3041 is disposed on the fourth metal layer 304 of the touch function layer 30. The orthographic projection of the second touch signal line 3041 on the substrate 10 is located between the orthographic projections of the two adjacent first touch signal lines 2011 on the substrate 10. That is, in a direction parallel to the plane of the substrate 10, the first touch signal line 2011 and the second touch signal line 3041 are arranged at intervals in sequence. As such, for each of the first touch signal lines 2011 and the second touch signal lines 3041 in FIG. 14, two adjacent touch signal lines may be spaced apart, longitudinally (direction Z perpendicular to the plane of substrate 10) and transversely (direction X parallel to the plane of substrate 10), and coupling between the touch signal lines may be reduced. Equivalently, the longitudinal (direction Z perpendicular to the plane where the substrate 10 is located) spacing and transverse (direction X parallel to the plane where the substrate 10 is located) spacing between the adjacent first touch signal line 2011 and the second touch signal line 3041 may be increased.

In one embodiment, the first touch signal line 2011 and the second touch signal line 3041 are disposed on the driving array layer 20 and the touch function layer 30 respectively. Equivalently, the adjacent first touch signal line 2011 and the second touch signal line 3041 are further apart in the longitudinal direction (direction Z perpendicular to the plane of the substrate 10). The orthographic projection of the second touch signal line 3041 on the substrate 10 is located between the orthographic projections of the adjacent two first touch signal lines 2011 on the substrate 10. Equivalently, two adjacent first touch signal lines 2011 are further apart in the lateral direction (direction X parallel to the plane of the substrate 10), and two adjacent second touch signal lines 3041X are further apart in the lateral direction (direction X parallel to the plane of the substrate 10). Accordingly, the capacitive coupling interference between adjacent touch signal lines may be reduced, the touch detection performance of the entire panel may be improved, and the touch effect may thus be improved.

FIG. 14 only illustrates that, when the fourth metal layer 304 includes a plurality of second touch signal lines 3041, the first touch signal line 2011 of the first metal layer 201 may be higher than the first fixed potential signal line 2012. The first fixed potential signal line 2012 may be used to shield the lower lateral capacitance of two adjacent first touch signal lines 2011. Details may be understood with reference to effects of the configuration shown in FIG. 10, and will not be elaborated here.

Figure 15:
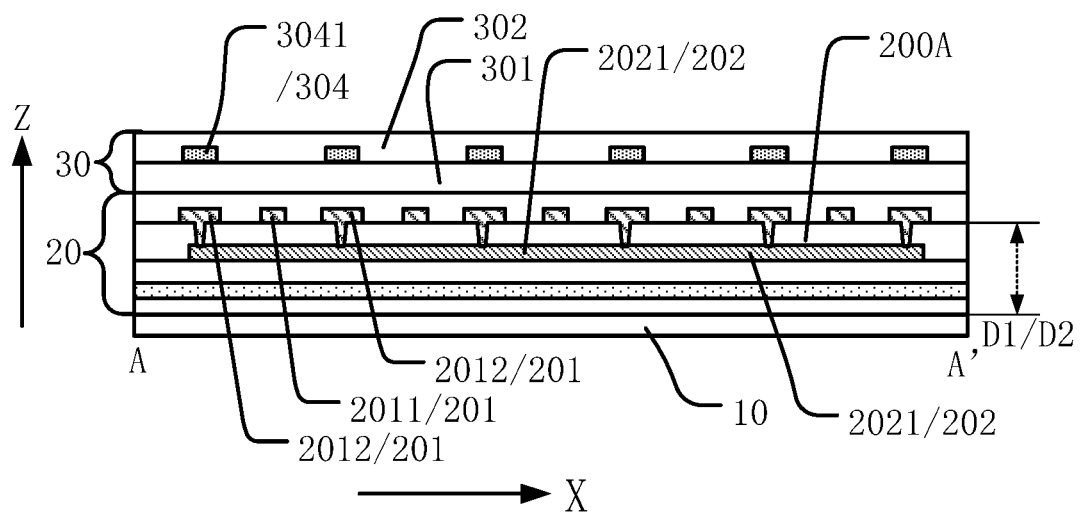
FIG. 15 illustrates another schematic cross-sectional structural diagram along the A-A' direction in FIG. 3, consistent with the disclosed embodiments of the present disclosure.

FIG. 15 illustrates another schematic cross-sectional structural diagram along the A-A' direction in FIG. 3, consistent with the disclosed embodiments of the present disclosure. Referring to FIG. 15, in some other embodiments, the fourth metal layer 304 includes a plurality of second touch signal lines 3041, and the first touch signal lines 2011 of the first metal layer 201 may be of a same height as the first fixed potential signal line 2012. The first fixed potential signal line 2012 may be used to shield the facing capacitance of two adjacent first touch signal lines 2011. Details may be understood with reference to effects of the configuration shown in FIG. 7, and will not be elaborated here.

Figure 16:
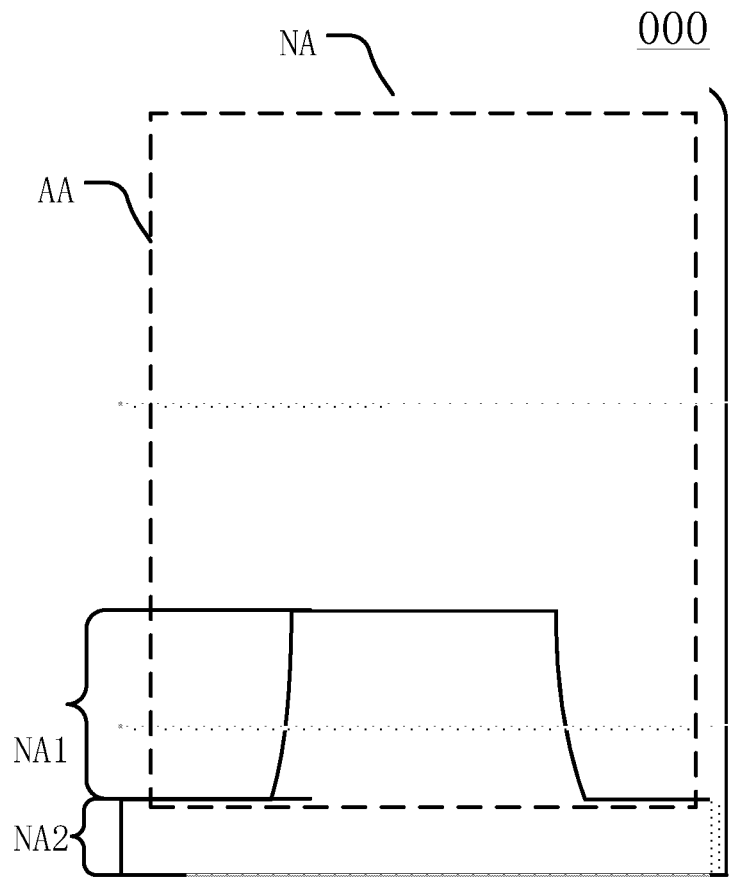
FIG. 16 illustrates another schematic plan view of a display panel consistent with the disclosed embodiments of the present disclosure.
Figure 17:
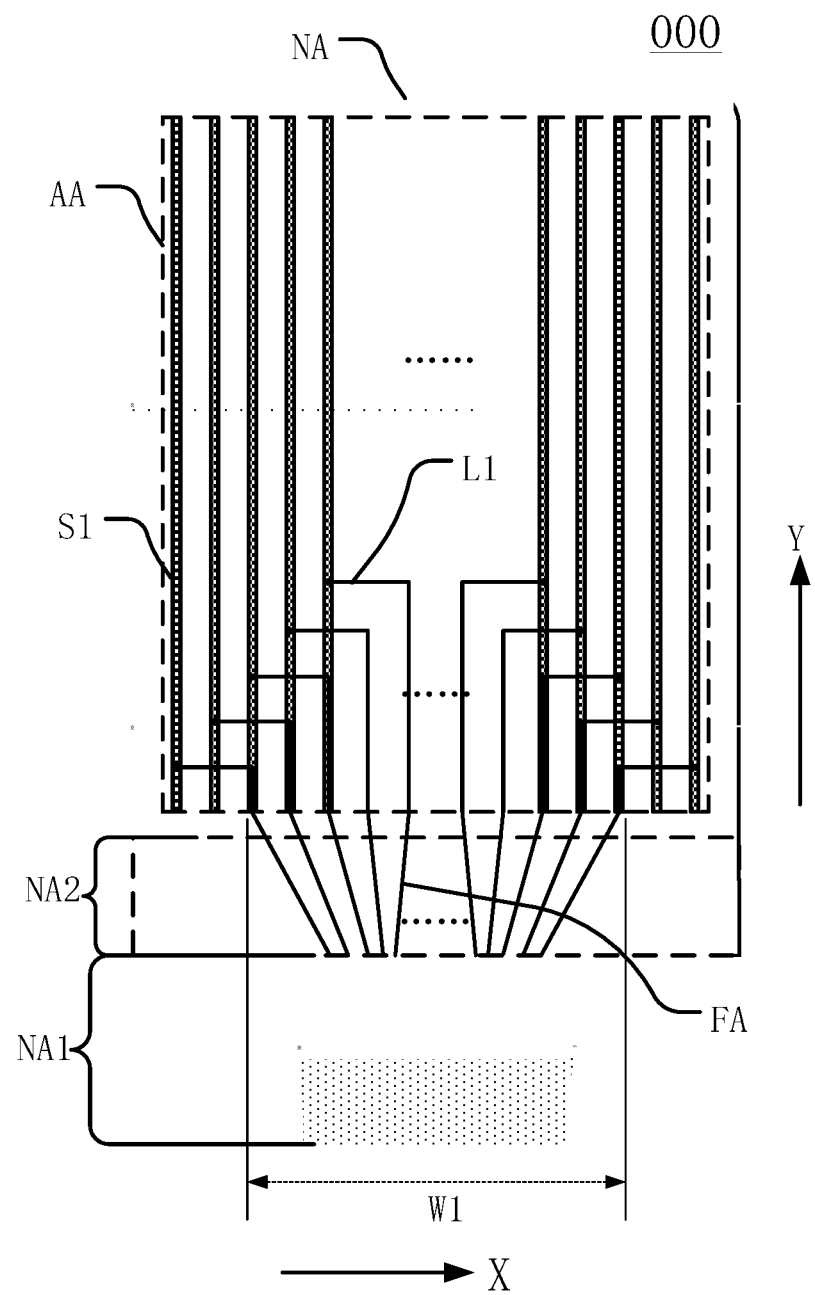
FIG. 17 illustrates a schematic plan view of the display panel in FIG. 16 before bending, consistent with the disclosed embodiments of the present disclosure.

FIG. 16 illustrates another schematic plan view of a display panel consistent with the disclosed embodiments of the present disclosure. FIG. 17 illustrates a schematic plan view of the display panel in FIG. 16 before bending. To illustrate the structure of the display panel, transparency filling is made in FIGS. 16 and 17. Referring to FIGS. 16 and 17, in one embodiment, the display area AA of the display panel 000 includes a plurality of first data lines S1 extending along the first direction Y, and the non-display area NA includes a plurality of fan-out lines FA. The first data line S1 is electrically connected to the fan-out line FA through at least one first connection line L1. The first connection line L1 is disposed in the display area AA. The first connection line L1 is disposed on the first metal layer 201.

In one embodiment, the display area AA of the display panel 000 includes a plurality of first data lines S1 extending along the first direction Y. The first data lines S1 may be disposed in the display area AA on two sides of the display panel 000. The first data lines S1 are electrically connected to the fan-out lines FA through the first connection lines L1. The fan-out lines FA may be understood as traces in the fan-out area, or as traces in the non-display area NA, used to electrically connect the first connection lines L1 to a welding pad in the binding area of the flexible circuit board. The present disclosure does not limit positions of the fan-out lines FA in the non-display area NA, as long as the first connection lines L1 of the display area AA may be electrically connected to the flexible circuit board subsequently bound.

In one embodiment, the first connection lines L1 are disposed in the display area AA. The first connecting lines L1 may have a bent shape or other shapes, provided that after one end of the first connection line L1 is connected to the first data line S1 at the edge display area, when the other end of the first connection line L1 leads out of the display area AA and is connected to the fan-out line FA, the connection point is close to the middle area of the panel. In one embodiment, the first connection line L1 is disposed in the display area AA, preventing the first connection line L1 from occupying the space of the non-display area NA. As shown in FIG. 17, in the display area AA, the first connection line L1 may gradually extend toward the middle area of the display area AA, and then connect to the non-display area NA. As such, the fan-out lines FA connected to the first connection lines L1 may be kept as far away from the left and right edges of the panel as possible in the second direction X in FIG. 17. Accordingly, the width W1 occupied by the fan-out lines FA in the second direction X in FIG. 17 may be reduced, further reducing the lower frame of the display panel 000.

Optionally, in one embodiment, the first connection line L1 may be made by using a film layer added to the display panel 000. For example, a first metal layer 201 may be disposed on a side of the driving array layer 20 facing the touch function layer 30, such that the first metal layer 201 may be closest to the touch function layer. Disposing the first connection line L1 on the first metal layer 201 may prevent the first connection line L1 from occupying the film space of the driving array layer 20. Accordingly, manufacturing process difficulty may be reduced, and manufacturing process efficiency may be improved.

In one embodiment, before disposing the first touch signal lines 2011 and the first fixed potential signal lines 2021 on the first metal layer, the first metal layer 201 may only include a plurality of first connection lines L1. Accordingly, the layout space may be sufficient, and there may be enough margin space for disposing the first touch signal lines 2011 and the first fixed potential signal lines 2021. As such, a narrow frame may be achieved, and in addition, the touch detection effect of the panel may be improved by disposing the first touch signal lines 2011 on the first metal layer 201.

It may be understood that the design structure of the first connection line L1 in the present disclosure may meet high-resolution requirements of the display panel 000. Even when the quantity of data lines becomes larger, the first connection lines L1 are disposed in the display area AA, and the first connection lines L1 do not need to occupy the space for the fan-out lines. As such, the width W1 occupied by the fan-out lines FA in the second direction X may still be compressed. Accordingly, while high-resolution requirements may be met, display performance may be improved, and narrow frames may be achieved.

Figure 18:
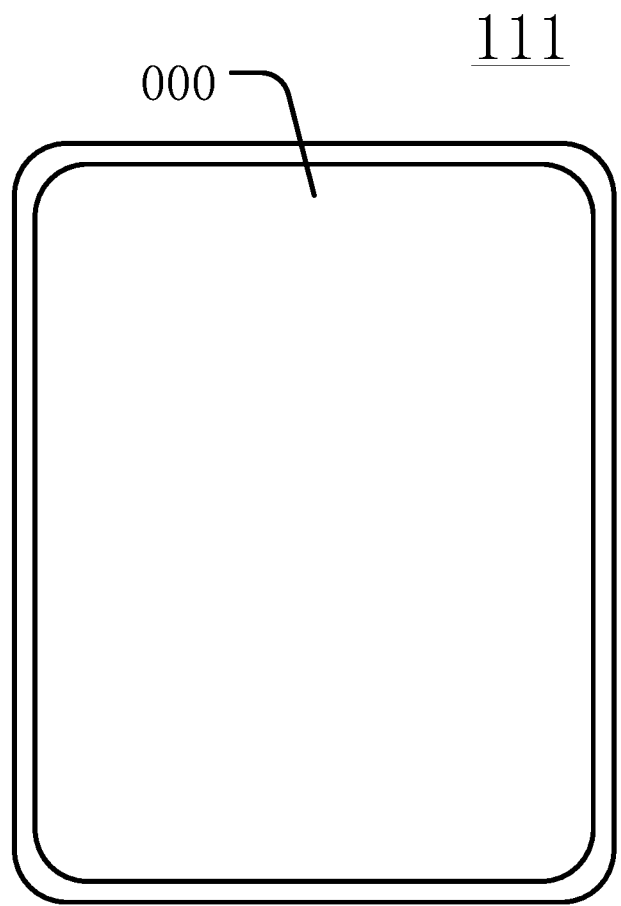
FIG. 18 illustrates a schematic plan view of a display device consistent with the disclosed embodiments of the present disclosure.

FIG. 18 illustrates a schematic plan view of a display device consistent with the disclosed embodiments of the present disclosure. Referring to FIG. 18, the present disclosure provides a display device 111. The display device 111 includes the display panel 000 provided by the present disclosure. FIG. 18 only takes a mobile phone as an example to illustrate the display device 111. It may be understood that the display device 111 provided by the present disclosure may be a computer, a television, a vehicle-mounted display device, or other display devices 111 with a display function. The present disclosure does not limit a specific type of display device. The display device 111 provided by the present disclosure has beneficial effects of the display panel 000 provided by the present disclosure. For details, reference may be made to specific descriptions of the display panel 000 in the present disclosure, which will not be elaborated here.

As disclosed, the technical solutions of the present disclosure have the following advantages.

The display panel provided by the present disclosure may be a flexible organic light-emitting display panel. The display panel may include a display area and a non-display area. The non-display area includes a bending area and a first area. A side of the first area away from the bending area may later be used to bind a flexible circuit board. After the display panel in the bending area is bent, the first area and the flexible circuit board subsequently bound to the first area may be bent toward a side away from a light-emitting surface of the display panel. As such, the size of the lower frame of the display panel may be reduced, and the screen-to-body ratio may be increased.

In the film structure of the display panel, the driving array layer at least includes a first metal layer, and no other metal layers are disposed between the first metal layer and the touch function layer. Among conductive metal layers of the driving array layer, the first metal layer may be understood as a metal layer that is closest to the touch function layer over the conductive metal layers. In the first area where no flexible encapsulation layer is disposed, a plurality of first touch signal lines may be disposed on the first metal layer, and difficulty of replacing the touch signal lines from the touch function layer to the first metal layer may be reduced. Accordingly, manufacturing process difficulty may be reduced.

After the plurality of first touch signal lines is disposed on the first metal layer, coupling interference problems between the touch signal lines originally included in the touch function layer may be eased. The first metal layer may be disposed with a plurality of first fixed potential signal lines originally required by the panel. At least one first fixed potential signal line is disposed between two adjacent first touch signal lines. The first fixed potential signal line may be used to shield coupling interferences between the two adjacent first touch signal lines. Accordingly, overall touch detection performance of the panel may be improved.

Since the first fixed potential signal line is a structure originally included in the panel, the manufacturing process and the panel structure may not be increased. Accordingly, while improving the production efficiency and structural simplicity of the display panel, the overall touch detection performance of the panel may be improved.

The embodiments disclosed herein are exemplary only and not limiting the scope of the present disclosure. Various combinations, alternations, modifications, equivalents, or improvements to the technical solutions of the disclosed embodiments may be obvious to those skilled in the art. Without departing from the spirit and scope of this disclosure, such combinations, alternations, modifications, equivalents, or improvements to the disclosed embodiments are encompassed within the scope of the present disclosure.

What is claimed is:

1. A display panel, including a display area and a non-display area, wherein:
   the non-display area includes a bending area and a first area, and along a first direction, the first area is located on a side of the bending area away from the display area; and
   the display panel comprises a substrate, a driving array layer disposed on a side of the substrate, and a touch function layer disposed on a side of the driving array layer away from the substrate, wherein:
      the driving array layer at least includes a first metal layer, and no other metal layers are disposed between the first metal layer and the touch function layer;
      in the first area, the first metal layer includes a plurality of first touch signal lines and a plurality of first fixed potential signal lines; and
      at least one first fixed potential signal line of the plurality of first fixed potential signal lines is disposed between two adjacent first touch signal lines of the plurality of first touch signal lines.

2. The display panel according to claim 1, wherein:
the plurality of first touch signal lines and the plurality of first fixed potential signal lines each extend along the first direction.

3. The display panel according to claim 1, wherein:
the plurality of first fixed potential signal lines includes either a positive power supply signal line or a negative power supply signal line.

4. The display panel according to claim 1, wherein:
the plurality of first fixed potential signal lines includes a negative power supply signal line.

5. The display panel according to claim 1, wherein:
along a direction perpendicular to a plane of the substrate, a spacing from a first touch signal line of the plurality of first touch signal lines to the substrate is equal to a spacing from a first fixed potential signal line of the plurality of first fixed potential signal lines to the substrate.

6. The display panel according to claim 5, wherein:
the driving array layer further includes a second metal layer, wherein the second metal layer is disposed on a side of the first metal layer close to the substrate, and a first insulating layer is disposed between the first metal layer and the second metal layer; and
the second metal layer includes a plurality of second metal parts, and the plurality of first fixed potential signal lines is electrically connected to the plurality of second metal parts.

7. The display panel according to claim 6, wherein:
the plurality of first fixed potential signal lines and the plurality of second metal parts are electrically connected through a plurality of first vias, wherein a first via of the plurality of first vias penetrates a thickness of the first insulating layer.

8. The display panel according to claim 7, wherein:
at least part of the plurality of first vias is located at a periphery of the first area.

9. The display panel according to claim 6, wherein:
the second metal part is an entire-surface structure, and an orthographic projection of the second metal part on the substrate covers an orthographic projection of the plurality of first touch signal lines on the substrate.

10. The display panel according to claim 1, wherein:
along a direction perpendicular to a plane of the substrate, a spacing from a first touch signal line of the plurality of first touch signal lines to the substrate is greater than a spacing from a first fixed potential signal line of the plurality of first fixed potential signal lines to the substrate.

11. The display panel according to claim 10, wherein:
the driving array layer further includes a second metal layer, wherein the second metal layer is disposed on a side of the first metal layer close to the substrate, and a first insulating layer is disposed between the first metal layer and the second metal layer;
the first insulating layer includes a plurality of hollow parts, and an orthographic projection of the plurality of hollow parts on the substrate overlaps with an orthographic projection of the plurality of first fixed potential signal lines on the substrate; and
the second metal layer includes a plurality of second metal parts, and in a hollow part of the plurality of hollow parts, a first fixed potential signal line of the plurality of first fixed potential signal lines is in direct contact with a second metal part of the plurality of second metal parts.

12. The display panel according to claim 1, wherein:
the touch function layer at least includes a first protective layer and a second protective layer, wherein the second protective layer is disposed on a side of the first protective layer away from the substrate, the first protective layer includes an inorganic layer, and the second protective layer includes an organic layer.

13. The display panel according to claim 12, wherein:
the touch function layer includes a third metal layer, wherein the third metal layer is disposed between the first protective layer and the second protective layer;
in the first area, the third metal layer includes a third metal part, wherein the third metal part is an entire-surface structure, and an orthographic projection of the third metal part on the substrate covers an orthographic projection of the plurality of first touch signal lines on the substrate; and
the third metal part is electrically connected to a first fixed potential signal line of the plurality of first fixed potential signal lines through a second via.

14. The display panel according to claim 13, wherein:
at least part of the third metal part is in direct contact with the first fixed potential signal line in the second via.

15. The display panel according to claim 13, wherein:
along a direction perpendicular to a plane of the substrate, a spacing from at least part of the third metal part to the substrate is equal to a spacing from a first touch signal line of the plurality of first touch signal lines to the substrate.

16. The display panel according to claim 12, wherein:
the touch function layer includes a fourth metal layer, wherein the fourth metal layer is disposed between the first protective layer and the second protective layer; and
in the first area, the fourth metal layer includes a plurality of second touch signal lines, wherein an orthographic projection of a second touch signal line of the plurality of second touch signal lines on the substrate is located between orthographic projections of two adjacent first touch signal lines of the plurality of first touch signal lines on the substrate.

17. The display panel according to claim 16, wherein:
an orthographic projection of the plurality of second touch signal lines on the substrate overlaps with an orthographic projection of the plurality of first fixed potential signal lines on the substrate.

18. The display panel according to claim 1, wherein:
the display area includes a plurality of first data lines extending along the first direction, and the non-display area includes a plurality of fan-out lines;
a first data line of the plurality of first data lines is electrically connected to a fan-out line of the plurality of fan-out lines through at least one first connection line, and the first connection line is disposed in the display area; and
the first connection line is disposed on the first metal layer.

19. The display panel according to claim 1, wherein:
the driving array layer includes a thin film transistor array layer, wherein the first metal layer is disposed on a side of the thin film transistor array layer away from the substrate.

20. A display device, comprising a display panel including a display area and a non-display area, wherein:
the non-display area includes a bending area and a first area, and along a first direction, the first area is located on a side of the bending area away from the display area; and
the display panel comprises a substrate, a driving array layer disposed on a side of the substrate, and a touch function layer disposed on a side of the driving array layer away from the substrate, wherein:
the driving array layer at least includes a first metal layer, and no other metal layers are disposed between the first metal layer and the touch function layer;
in the first area, the first metal layer includes a plurality of first touch signal lines and a plurality of first fixed potential signal lines; and
at least one first fixed potential signal line of the plurality of first fixed potential signal lines is disposed between two adjacent first touch signal lines of the plurality of first touch signal lines.

* * * * *